May 17, 1960 D. D. HOLMES 2,937,340
AUTOMATIC GAIN CONTROL SYSTEM FOR SIGNAL RECEIVERS
Filed Nov. 30, 1956
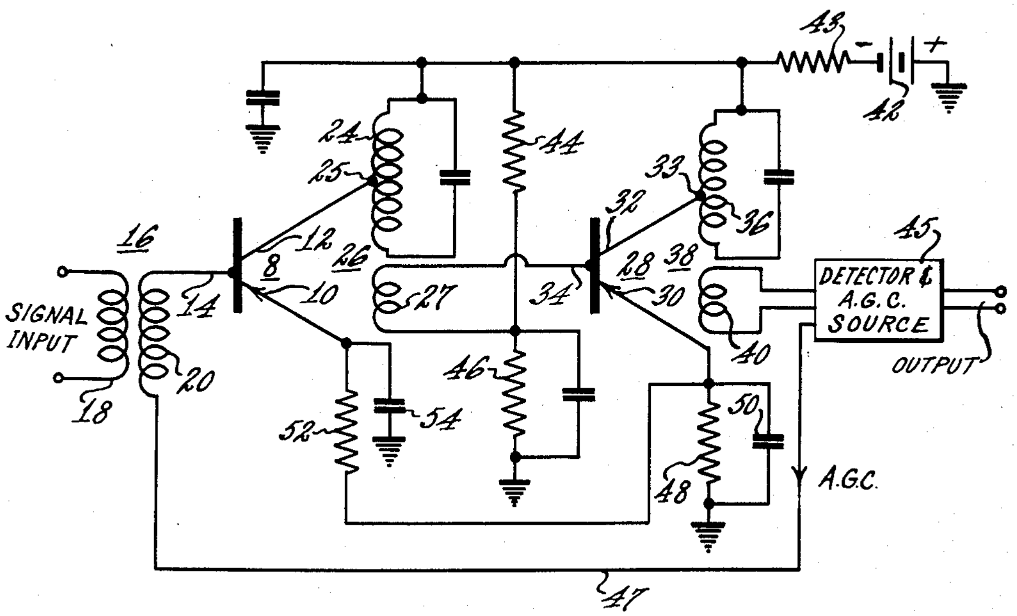
INVENTOR.
DAVID D. HOLMES
BY H.D. Newton
ATTORNEY 2,937,340

AUTOMATIC GAIN CONTROL SYSTEM FOR SIGNAL RECEIVERS

David D. Holmes, Princeton, N.J., assignor to Radio Corporation of America, a corporation of Delaware Application November 30, 1956, Serial No. 625,440

2 Claims. (Cl. 330—21)

This invention relates to automatic gain control systems for radio signal receivers and the like, and in particular to gain control systems for radio signal receivers of the type employing transistors in the signal translating or amplifying portions thereof.

Signal receivers are generally provided with an automatic gain control (AGC) system for maintaining the amplitude of the intermediate frequency signal applied to the second detector substantially constant over a relatively wide range of variation in the strength or amplitude of the received signal. By providing an AGC system for a receiver, it may be tuned from strong to relatively weak signals without the necessity of resetting the manual gain or volume control. In signal receiving systems employing transistors, a crystal diode is often used as the second detector and AGC source. An automatic gain control voltage or current, which is derived from the diode, is usually applied to the first transistor intermediate frequency (I.F.) amplifier to control its gain. To obtain an AGC constant-voltage reference for the gain controlled stage or stages, it is the general practice to provide a separate high current bleeder network or a tap on the biasing battery. One of the important objects of the present invention is to provide improved means, in a transistorized signal receiving system, for obtaining an AGC constant-voltage reference without the necessity of a separate high current bleeder network or special battery tap.

It is preferable, primarily because of distortion consideration, to increase the signal handling capabilities under strong signal conditions of the final intermediate frequency amplifier stage of a signal receiving system. It is, therefore, another object of the present invention to provide an improved automatic gain control system for transistor signal receiving systems and the like wherein the signal handling capability of the last intermediate frequency amplifier stage is increased under strong signal conditions.

Another and incidental object of the present invention is to provide means, in a signal receiving system of the type referred to, for obtaining effective squelch action without the addition of extra circuit components.

In accordance with the invention, the intermediate frequency amplifier transistors of a signal receiver are connected in such a manner that the emitter current of one of the transistors increases upon the application of an AGC voltage to another transistor. Thus the signal handling capability of the one transistor is increased under strong signal conditions. The circuit arrangement is such that the base voltage of the one transistor is fixed, thus substantially fixing its emitter voltage. The potential drop across an emitter resistor of the one transistor is then used as a constant-voltage reference for the gain controlled transistor, eliminating the necessity of a separate high current bleeder network or battery tap.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which the single figure is a schematic circuit diagram of a transistor signal amplifier and AGC system embodying the invention.

Referring now to the drawing, a transistor 8 may be considered to be, for example, of the P–N–P junction type and includes an emitter 10, a collector 12, and a base electrode 14. The transistor 8 is connected for signal amplifying operation in the so-called common emitter configuration, and in the present example will be considered to be the first I.F. amplifier stage of a radio receiver. An input I.F. signal may be applied between the base 14 and the emitter 10 through an input transformer 16 having a primary winding 18 which is in inductive coupling relation with a secondary winding 20. One end of the secondary winding 20 is connected directly to the base 14, while the other end is connected to a detector and AGC current or voltage source 45 through the AGC lead 47.

Intermediate-frequency output signals from the first-stage transistor 8 are derived from between the collector 12 and the emitter electrode 10, which is at ground signal potential, through a tuned primary winding 24 of an output transformer 26 to which winding the collector 12 is connected at a tap 25. The secondary winding 27 of the output transformer 26 is connected at one terminal directly with the base 34 of a second transistor amplifier 28 which, in the present example, is the second I.F. amplifier stage, and may be considered to be a transistor of the P–N–P junction type. The transistor 28 includes emitter 30, collector 32, and base 34 electrodes. Amplified I.F. signals are derived from between the collector 32 of the transistor 28 and the emitter 30 which is at signal ground potential in the system shown. The collector 32 is connected to a tap 33 on a tuned primary winding 36 of an output transformer 38. The secondary winding 40 of the output transformer 38 will normally be connected to the second detector and AGC source 45 of the receiver, as shown.

To bias the transistors 8 and 28 for amplifier operation, a battery 42 is provided, the positive terminal of which is connected to a point of reference potential or circuit ground. In the event transistors of P type conductivity were used, the polarity of the battery 42 would be reversed from that shown. The negative terminal of the battery 42 is connected through a low resistance decoupling resistor 43 and the upper half of each of the primary windings 24 and 36 to the collectors 12 and 32, respectively. The negative terminal of the battery 42 is also connected to ground through the resistor 43 and a pair of voltage dividing resistors 44 and 46. The resistors 44 and 46 provide a relatively low current bleeder network. The junction of these resistors is connected through the secondary winding 27 of the first output transformer 26 to the base 34 of the second I.F. amplifier transistor 28. The resistance values of the resistors 44 and 46 are chosen to fix the base voltage at some predetermined negative value, in the present example —3 volts. This also fixes the emitter voltage of the transistor 28. In a typical example the resistors 43, 44, and 46 may have resistance values of 100; 6,800; and 1,800 ohms, respectively, with a battery 42 of 13.5 volts.

The emitter 30 of the second I.F. amplifier transistor 28 is connected to ground through a degenerative stabilizing resistor 48, which is by-passed for signal frequencies by a capacitor 50. By applying a fixed base voltage to the transistor 28, a substantially constant current of 2 milliamperes is maintained through the resistor 48. The voltage drop across the resistor 48, which in a typical example may have a resistance value of 1,500 ohms, is used, in accordance with one aspect of the invention, as a constant voltage reference for the gain controlled transistor 8. The voltage drop across the resistor 48 will be approximately 3 volts. By using the voltage drop across the resistor 48 as the gain control voltage reference, the need for a separate relatively high current bleeder network or a separate battery tap is obviated. To complete the circuit, in accordance with the invention, the emitter 10 of the first I.F. amplifier transistor 8 is connected through a resistor 52 to the junction of the emitter 30 of the second I.F. amplifier transistor 28 and the emitter resistor 48. The resistor 52, which may have a resistance of 1,000 ohms, is by-passed by a capacitor 54 for signal frequencies.

It will be assumed, in describing the operation of the circuit, that the AGC voltage which is applied to the base 14 of the gain controlled stage transistor 8 from the detector and AGC source 45 will vary between —4 volts under zero signal conditions, and —3 volts under strong signal conditions. Under zero signal conditions, that is in the absence of an applied signal, there will be a one volt (4 volts minus 3 volts) potential difference across the emitter resistor 52 of the first I.F. amplifier transistor 8, and 1 milliampere of emitter current will flow in the transistor 8. Since the current in the emitter resistor 48 of the second I.F. amplifier transistor 28 is held substantially constant at 2.0 milliamperes, the emitter current of the transistor 28 is 2.0 milliamperes minus 1.0 milliampere or 1.0 milliampere. In the presence of a strong signal, the AGC voltage which is applied to the base 14 of the transistor 8 becomes less negative, thus reducing the forward bias on this transistor and consequently its gain. This reduces the current in the transistor 8. By connecting the emitter 10 of the first transistor to the emitter 30 of the second transistor 28, however, the emitter current of the second transistor 28 will increase as the emitter current of the first transistor 8 is reduced by the AGC action.

Thus, if the circuit components are chosen so that the emitter current of the first transistor 8 is reduced to or near zero under strong-signal conditions, the emitter current of the second transistor 28 will increase a like amount, such as to 2 milliamperes for example. Thus the desirable effect of having the emitter current and thus the signal handling capacity of the second transistor 28 increase under strong signal conditions is achieved. Furthermore, by increasing the resistance value of the emitter resistor 48, while using the same values for the remaining components, squelch action may be obtained according to the invention. By increasing the resistance of the emitter resistor 48, the current in the second transistor 28 may be reduced to a value below the current in the first transistor 8. The resistance of the resistor 48 may be chosen or adjusted so that the emitter current of the transistor 28 is 0.25 milliampere. Accordingly, in the absence of a received signal, but in the presence of a noise signal, the gain of the second transistor 28 is reduced to a point where there is effectively no signal translation through the receiver. In the presence of a received signal, however, the AGC voltage decreases the current in the first transistor 8 and increases the current in the second transistor 28. Thus there is signal translation. Under strong signal conditions, the AGC voltage will be effective to reduce the gain of the first transistor 8, thus obtaining the desired AGC action.

An AGC system embodying the invention uses a minimum number of circuit elements and obtains the desired constant-voltage reference for the gain controlled stages without separate components. In addition, the signal handling capabilities of the final I.F. stage are increased under strong signal conditions. Thus economical as well as quality performance characterize circuits embodying the invention.

What is claimed is:

1. In a signal receiving system, the combination comprising, a gain controlled stage including a first transistor having base, emitter, and collector electrodes, a signal amplifying stage including a second transistor having base, emitter, and collector electrodes, means providing a signal input circuit connected for applying an input signal between the base and emitter electrodes of said first transistor, means coupling the collector electrode of said first transistor with the base electrode of said second transistor for signal translation therebetween, means providing a signal output circuit connected for deriving an output signal between the collector and emitter electrodes of said second transistor, direct-current bias supply means connected between a point of reference potential in said system and the collector electrodes of said first and second transistors, a first resistor of predetermined resistance connected between the emitter electrode of said second transistor and said point of reference potential, means including a low current bleeder network connecting said bias supply means with the base electrode of said second transistor for fixing the base and emitter voltages of said second transistor to provide substantially constant direct current flow through said first resistor and a substantially constant voltage drop thereacross under static operating conditions, direct-current conductive means including a second resistor having resistance of a smaller magnitude than said predetermined resistance connected between the emitter electrode of said first transistor and the junction of said first resistor and the emitter electrode of said second transistor, and automatic gain control means connected with the base electrode of said first transistor for reducing the gain and emitter current thereof with increases in applied signal strength to simultaneously increase the emitter current and signal handling capability of said second transistor under relatively strong signal conditions.

2. In a signal receiving system, the combination comprising, a gain controlled stage including a first transistor having base, emitter, and collector electrodes, a signal amplifying stage including a second transistor having base, emitter, and collector electrodes, means including an input circuit coupled to said first transistor, means coupling said first and second transistors in cascade relation, means including an output circuit coupled to said second transistor, a common emitter resistor for said first and second transistors, means providing a source of automatic gain control potential which varies in amplitude as a function of received signal level connected with said first transistor for reducing the gain thereof in response to increases in applied signal strength, means connecting said first and second transistors to provide substantially constant current through said common emitter resistor to provide a reference voltage for said transistors, means for biasing said second transistor so that said signal amplifying stage is ineffective for signal amplification when no signals are being received by said receiving system and so that said signal amplifying stage conducts increased current for increasingly stronger signal conditions as the constant current through said common emitter resistor is diverted from said first transistor to said second transistor, to increase the effectiveness of said second transistor for signal amplification.

References Cited in the file of this patent

UNITED STATES PATENTS

| | | |
|---|---|---|
| 2,773,945 | Theriault | Dec. 11, 1956 |
| 2,789,164 | Stanley | Apr. 16, 1957 |
| 2,853,602 | Farber | Sept. 23, 1958 |

FOREIGN PATENTS

| | | |
|---|---|---|
| 201,973 | Australia | May 30, 1956 |

OTHER REFERENCES

Chow et al.: "Automatic . . . Amplifiers," Proceedings of the IRE, September 1955, pages 1119–1127.

Leslie, "Transistor . . . Video," Electronics, August 1956, pages 142–145.